United States Patent [19]

Sugiyama et al.

[11] Patent Number: 4,887,024
[45] Date of Patent: Dec. 12, 1989

[54] PERSON DETECTING DEVICE

[75] Inventors: Masanori Sugiyama, Nishio; Takayoshi Masutani; Takao Shirai, both of Toyota, all of Japan

[73] Assignees: Aisin Seiki Kabushiki Kaisha; Toyota Jidosha Kabushiki Kaisha, both of Aichi, Japan

[21] Appl. No.: 263,500

[22] Filed: Oct. 27, 1988

[30] Foreign Application Priority Data

Oct. 27, 1987 [JP] Japan .................. 62-271268

[51] Int. Cl.⁴ ...................... G01R 27/26; G08B 21/00
[52] U.S. Cl. .................. 324/61 R; 324/61 P; 324/60 CD; 340/562
[58] Field of Search .......... 340/562; 324/60 C, 61 R, 324/60 CD

[56] References Cited

U.S. PATENT DOCUMENTS

| 3,864,668 | 2/1975 | Bickford . |
| 3,874,474 | 4/1975 | Quantz . |
| 3,898,472 | 8/1975 | Long . |
| 3,912,939 | 10/1975 | Quantz . |
| 4,065,715 | 12/1977 | Jaffe ............................ 324/60 CD |
| 4,295,132 | 10/1981 | Burney ............................ 340/562 |
| 4,348,662 | 9/1982 | Fontaine ........................ 340/562 |
| 4,476,461 | 10/1984 | Cabubia . |
| 4,491,841 | 1/1985 | Clark . |
| 4,796,013 | 1/1989 | Yasuda ............................ 340/562 |

FOREIGN PATENT DOCUMENTS

3044789A1 7/1982 Fed. Rep. of Germany .
62-227829 10/1987 Japan .
62-246209 10/1987 Japan .

Primary Examiner—Jose M. Solis
Attorney, Agent, or Firm—Sughrue, Mion, Zinn, Macpeak & Seas

[57] ABSTRACT

A person detecting device detects the presence and absence of a person in a certain space such as a vehicle compartment. The device includes means for sensing the capacitance between a pair of electrodes with a space where a person may present, oscillating means for providing a first pulse signal and means for delaying the first pulse signal and providing a second pulse signal delayed in response to the capacitance. The device further includes means for receiving the first and second pulse signals and providing a third pulse signal of a duty ratio determined in response to the capacitance. The third pulse signal is further converted to a value representing the duty ratio which is compared with at least a reference value preset for judging as to the presence and absence of the person.

20 Claims, 9 Drawing Sheets

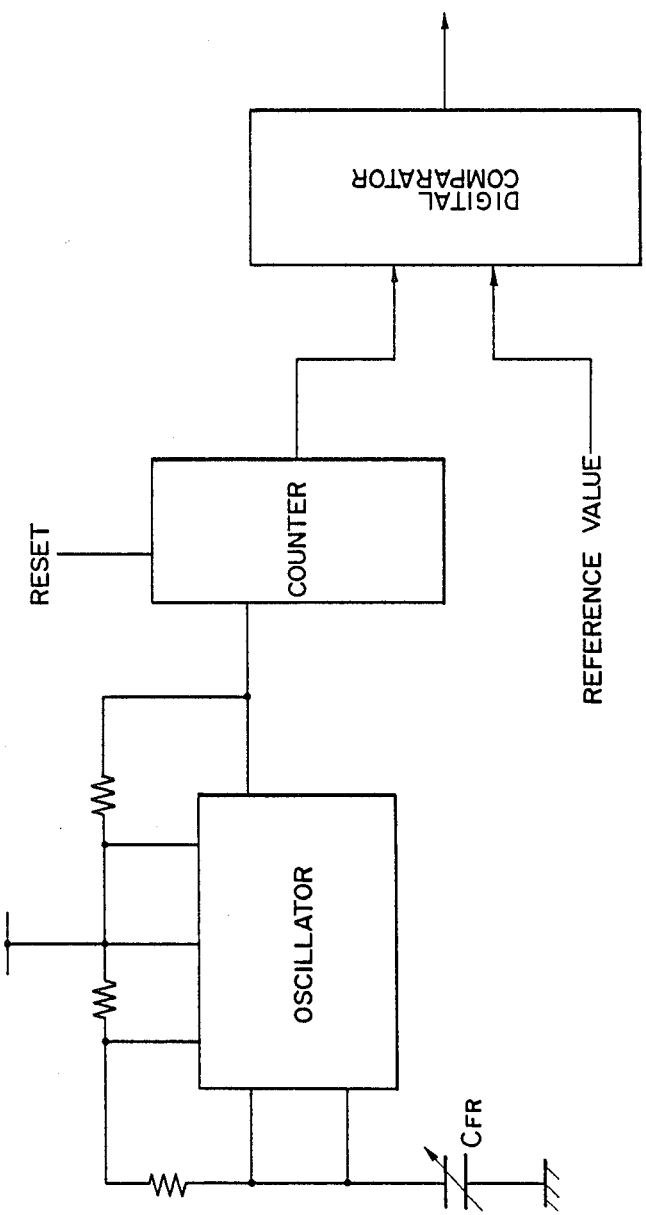

PERSON DETECTING DEVICE

BACKGROUND OF THE INVENTION

1. Field of the Invention

The present invention relates to a device for detecting the presence and absence of a person in a certain space, and more particularly to a person detecting device provided with means for sensing capacitance between a pair of electrodes facing to each other with a space, such as a compartment space of a vehicle in which a person is seated.

2. Description of the Prior Art

Recently, it is required to control various equipments in a vehicle depending upon whether or not a person is present in a compartment, or whether or not a part of the person's body is interposed in a space in the vehicle (hereinafter it is merely referred to as the presence and absence of a person), such as a seat-belt device automatically operated when a person gets on the vehicle, and a power window or a locking device automatically operated when a person gets off the vehicle. Accordingly, it is necessary for the vehicle to be provided with means for detecting the presence and absence of a person in the compartment. In Japanese Patent Laid-open Publication Nos. Sho 62-91882 and Sho 62-138780, it has been proposed to employ a conductor provided on a seat and a vehicle body as electrodes forming a capacitor by these electrodes and an inter-electrode compartment space in which the person is seated, and to sense the inter-electrode capacitance varying depending upon the presence and absence of a person in the compartment. In the latter Laid-open Publication disclosed is a device having an oscillator provided externally with the capacitor to detect the presence and absence of the person in the compartment through a change in the oscillation frequency in response to a change in the capacitance of the capacitor, as shown in FIG. 7. When the person takes a seat, the capacitance of a person sensing capacitor $C_{FR}$ is increased, so that the output frequency of the oscillator is reduced. Then, output data from a counter is compared with a reference value by a digital comparator. Accordingly, when the output data is less than the reference value, a signal "0" representing the presence of the person is provided.

However, in the prior art device as noted above, a so-called self oscillation is used, so that if a noise signal joins a pulse signal fed to the counter through the electrodes or the like, it is not possible to distinguish the noise signal from the pulse signal. Thus, this person detecting device may cause an error in operation. For example, when a noise at a frequency of 10 KHz joins the pulse signal through the electrodes of the person sensing capacitor, the frequency of 10 KHz is counted by the counter. In this case, if the reference value within a frequency range from 5 to 15 KHz is set to represent the presence of the person, the comparator will provide the signal representing the presence of the person. Accordingly, means for excluding such a continuous noise signal is needed, whereas it is extremely difficult for the device employing the oscillator of the self oscillation to be provided with such means.

SUMMARY OF THE INVENTION

It is, therefore, an object of the present invention to provide a person detecting device for accurately detecting the presence and absence of a person in a space such as a compartment of a vehicle or the like.

It is another object of the present invention to provide a person detecting device that discriminates a noise from a signal for judging as to the presence and absence of the person.

It is further object of the present invention to provide a person detecting device provided with duty ratio converting means for converting a change in the capacitance between a pair of electrodes with a space, where a person may present, into a duty ratio of a pulse signal, whereby a noise is discriminated easily.

In accomplishing these and other objects, a person detecting device comprises sensing means for sensing capacitance between at least a pair of electrodes facing to each other with a space, which capacitance varies depending upon the presence and absence of the person in the space. The detecting device comprises oscillating means for providing a first pulse signal, delay means for delaying the first pulse signal and providing a second pulse signal delayed in response to the capacitance of the sensing means, and duty ratio converting means for receiving the first and second pulse signals and providing a third pulse signal of a duty ratio determined in response to the capacitance to convert the third pulse signal to a value representing the duty ratio. The detecting device further comprises comparing means for comparing the value representing the duty ratio at least with a reference value preset for judging as to the presence and absence of the person to provide a resultant signal of comparison, and output means for receiving the resultant signal of the comparing means and judging as to the presence and absence of the person to output a signal of the result of judgement.

The oscillating means preferably includes means for generating a clock pulse signal at a predetermined frequency and means for dividing the clock pulse signal into a plurality of divided pulse signals of different frequencies and providing one of the divided pulse signals as the first pulse signal. The duty ratio converting means preferably includes means for converting the third pulse signal to a digital value corresponding to the duty ratio based on the clock pulse signal.

The comparing means preferably comprises magnitude comparing means for comparing the digital value in magnitude with at least a reference value preset for judging as to the presence and absence of the person.

Preferably, the comparing means further comprises coincidence comparing means coupled to the oscillating means for producing a reference pulse signal of the same frequency as the first pulse signal and comparing the third pulse signal with the reference pulse signal in periodic coincidence to provide an error signal to the output means when the third pulse signal do not synchronize with the reference pulse signal. The output means preferably includes means for holding the signal of the result of judgement unchanged when the error signal is fed thereto.

BRIEF DESCRIPTION OF THE DRAWINGS

The above stated objects and following description will become readily apparent with reference to the accompanying drawings, wherein like reference numerals denote like elements, and in which:

FIG. 7 is a block diagram of a person detecting device according to prior art.

DESCRIPTION OF THE PREFERRED EMBODIMENT

Figure 1:
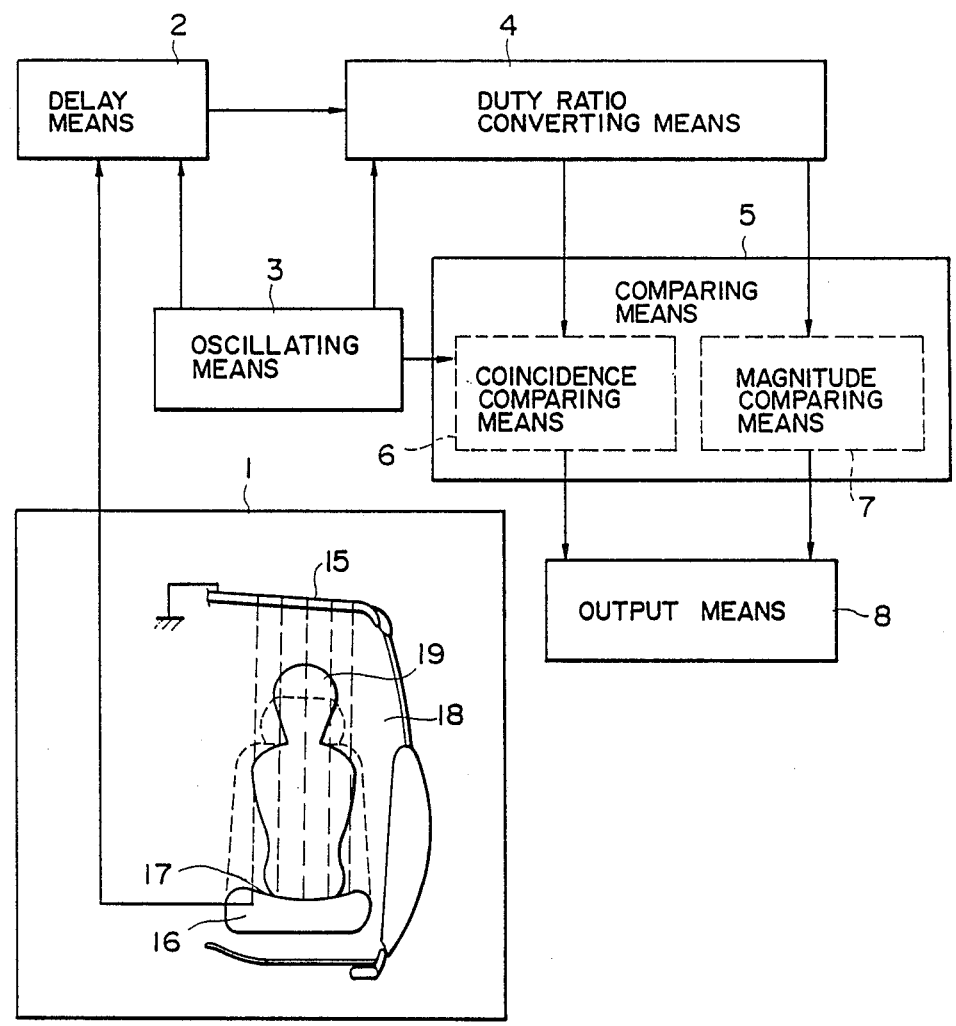
FIG. 1 is an overall block diagram illustrating a person detecting device according to the present invention.

Referring to FIG. 1, a person detecting device according to the present invention is provided with the sensing means 1 which comprises a vehicle body 15 and an electrode 17 provided on a seat 16 and facing to each other through a compartment space 18 between the vehicle body 15 and the seat 16.

The person detecting device further comprises oscillating means 3 which generates a clock pulse signal at a predetermined frequency and divides it into a plurality of divided pulse signals of different frequencies to provide one of the divided pulse signals as the first pulse signal. The first pulse signal is provided to delay means 2 which delays the first pulse signal in response to the capacitance of the sensing means 1 to provide a second pulse signal or delay pulse signal. This delay pulse signal is provided to duty ratio converting means 4 to develop a third pulse signal of a duty ratio determined in response to the capacitance of the sensing means 1. Further, the duty ratio converting means 4 converts the third pulse signal to a digital value corresponding to the duty ratio based on the clock pulse signal fed from the oscillating means 3.

Connected to the duty ratio converting means 4 is comparing means 5 which includes magnitude comparing means 7 for comparing the digital value in magnitude with at least a reference value preset for judging as to the presence and absence of the person, and coincidence comparing means 6 coupled to the oscillating means 3 for producing a reference pulse signal of the same frequency as the first pulse signal and comparing the third pulse signal with the reference pulse signal in periodic coincidence to provide an error signal to the output means 8 when the third pulse signal do not synchronize with the reference pulse signal.

Output means 8 is connected to the comparing means 5 from which it receives the resultant signal of comparison, and judges as to the presence and absence of the person to output a signal of the result of judgement. The output means 8 is arranged to hold the signal of the result of judgement unchanged when the error signal is fed thereto.

In operation, the capacitance of the sensing means 1 varies depending on the presence and absence of the person 19. Accordingly, the first pulse signal fed from the oscillating means 3 is delayed in response to the capacitance of the sensing means 1, so that the delay means 2 provides the delay pulse signal. The both pulse signals have same frequencies and one of them is delayed to the other. The delay pulse signal is fed to the duty ratio converting means 4 which develops the third pulse signal. This signal is converted into a digital value corresponding to the duty ratio based on the clock pulse signal. This digital value is compared with the reference value preset for judging as to the presence and absence of the person by the magnitude comparing means 7. Then, the presence and absence of the person are judged by the output means 8, so that the result of judgement is provided. If the noise signal joins the delay pulse signal through the body 15 for instance, the third pulse signal do not synchronize with the reference pulse signal. Then, the error signal is fed to the output means 8, so that the signal of the result of judgement is held as it is.

Figure 2A:
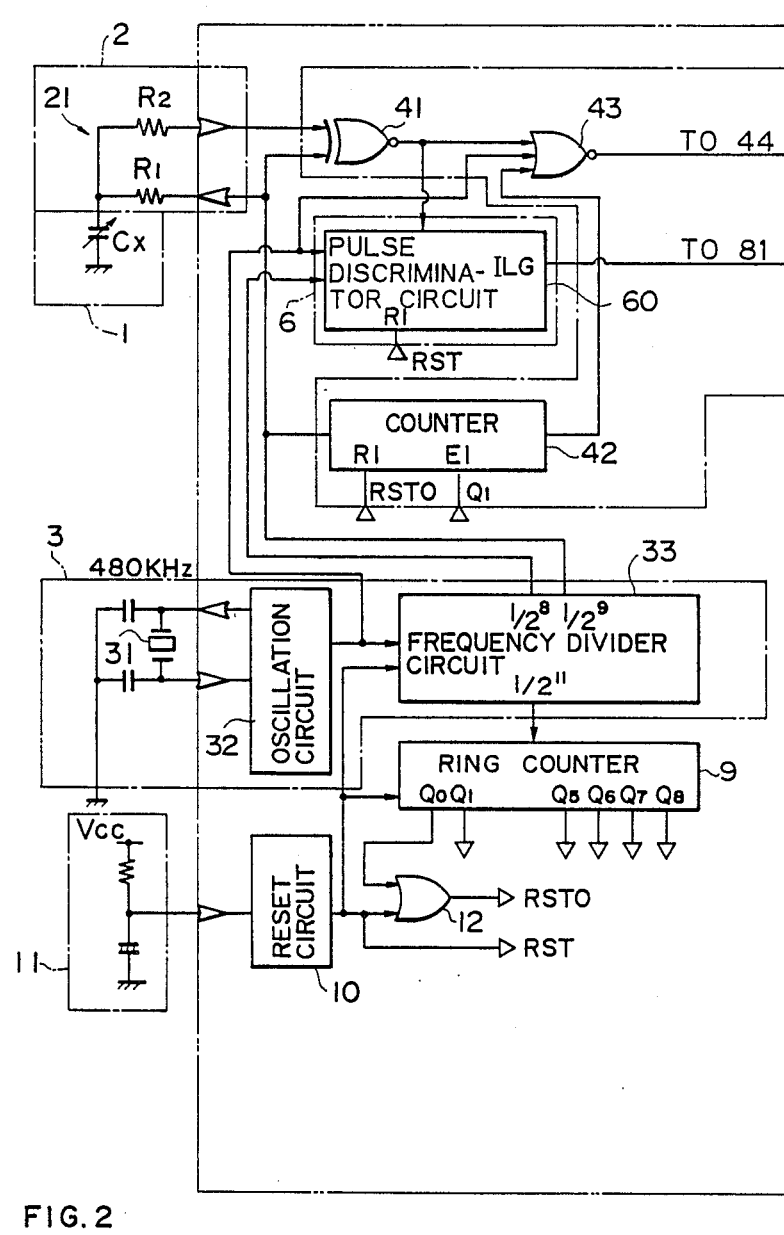
FIG. 2 consists of FIGS. 2A, 2B and 2C which form a schematic block diagram of the person detecting device.
Figure 2:
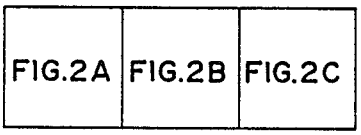
Figure 2B:
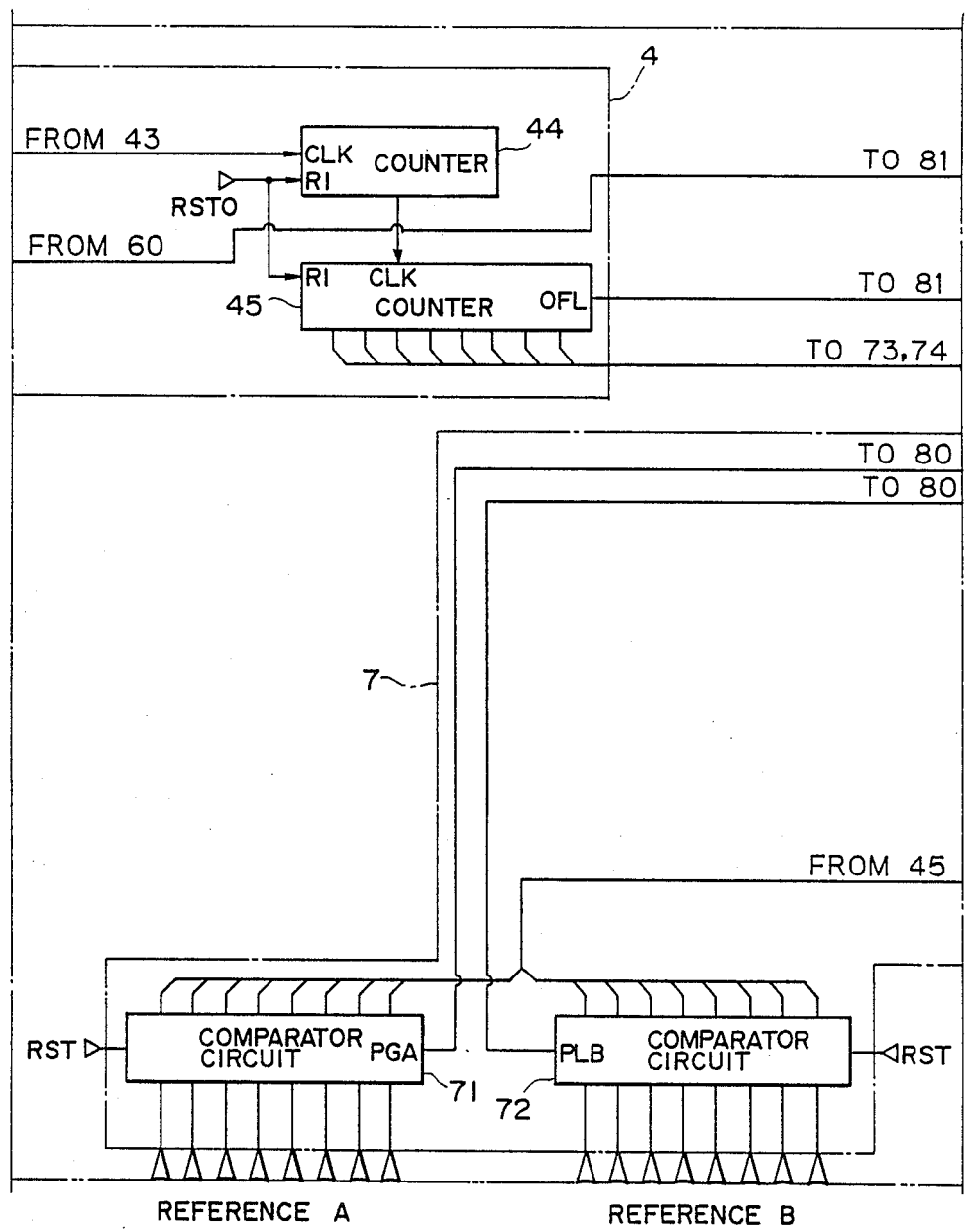
Figure 2C:
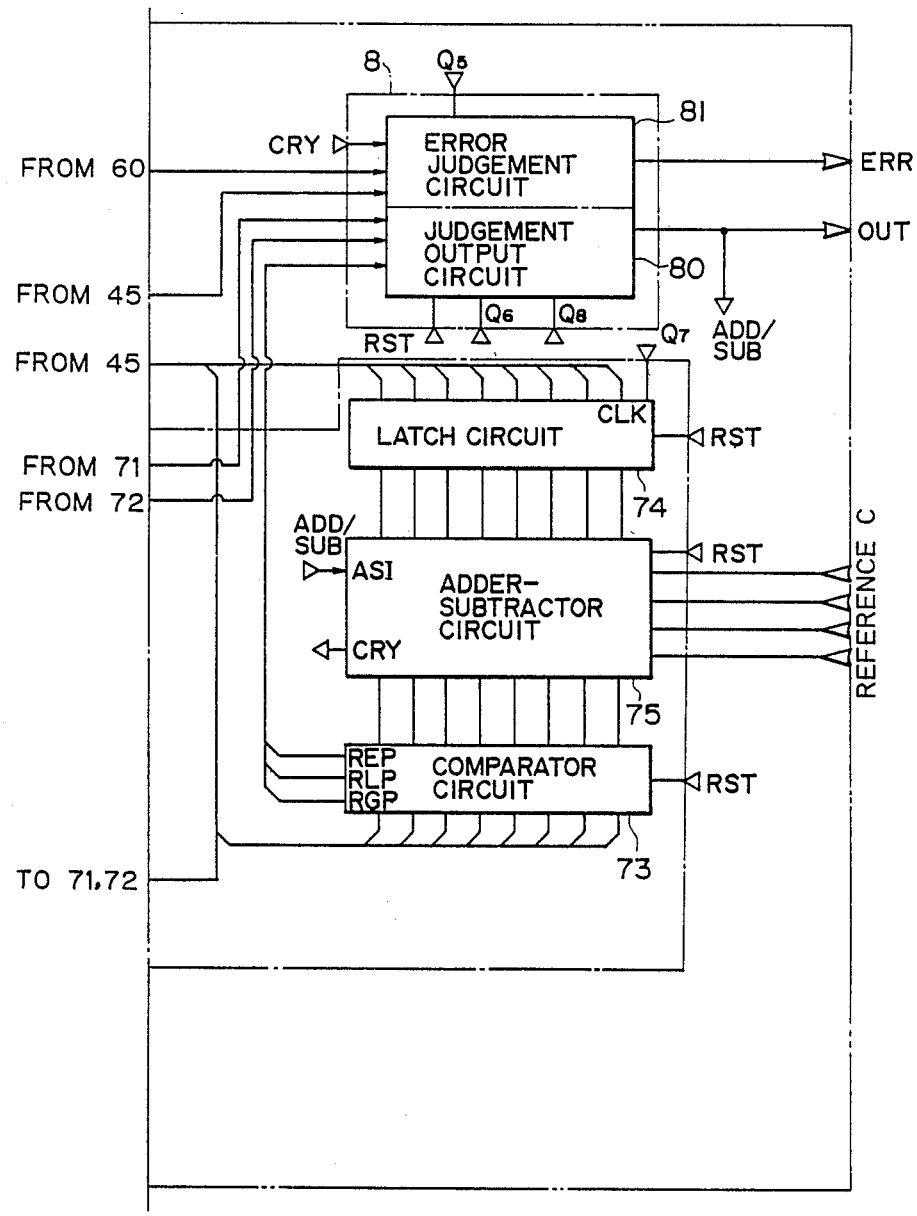

FIG. 2 illustrates the embodiment of the present invention more specifically. Referring to FIG. 2, sensing means 1 comprises a pair of electrodes constituted by the vehicle body 15 and the electrode 17 provided on the seat 16 shown in FIG. 1 and a capacitor Cx constituted by these electrodes with a compartment space therebetween. Delay means 2 comprises an integration circuit 21 which is constituted by the capacitor Cx and a pair of resistors R1 and R2 connected thereto.

Oscillating means 3 comprises a crystal oscillator 31, an oscillation circuit 32 and a frequency divider circuit 33. The crystal oscillator 31 and oscillation circuit 32 of, for example, CMOS inverter generate a clock pulse signal of a stable oscillation frequency of 480 KHz and which is divided into a plurality of pulse signals of different frequencies by the frequency divider circuit 33 provided with 14-stage dividing function, for example. Among these divided pulse signals, the eighth-stage and ninth-stage dividing outputs, that is, $\frac{1}{2}^8$ divided pulse signal and $\frac{1}{2}^9$ divided pulse signal are respectively fed to the coincidence comparing means 6 and the duty ratio converting means 4. Further, the oscillation circuit 32 is connected to the both means 6 and 4 for providing a system clock pulse signal. The eleventh-stage dividing output, that is, $\frac{1}{2}^{11}$ divided pulse signal is fed to a ring counter 9.

The ring counter 9 is used for control means of the person detecting device according to the present embodiment and constitutes a sequence generation cirucit. The ring counter 9 sequentially provides the following control signals $Q_0$ through $Q_8$ in accordance with the $\frac{1}{2}^{11}$ divided pulse signal of the frequency divider circuit 33. The ring counter 9 provides a signal $Q_0$ to respective reset terminals RI of counters 42, 44, and 45 through an OR gate 12, a signal $Q_1$ to a count enable terminal EI of the counter 42, and a signal $Q_7$ to a clock terminal CLK of a latch circuit 74. Further, signals $Q_5$, $Q_6$ and $Q_8$ of the ring counter 9 are supplied to the output means 8. RSTO shown in FIG. 2 designates an output signal of the OR gate 12. Accordingly, when the ring counter 9 provides the signal $Q_0$, the counters 42, 44 and 45 are reset. When the ring counter 9 provides the signal $Q_1$, the counter 42 starts counting. Further, when the ring counter 9 provides the signal $Q_7$, the latch circuit 74 latches the result of counting fed from the counter 45.

The reset circuit 10 is so arranged to reset respective circuits supplied with the signal RST shown in FIG. 2 in addition to the ring counter 9 and the frequency divider circuit 33, and reset each counter supplied with the signal RSTO shown in FIG. 2 through the OR gate 12 for initialization, when power is supplied by a power source 11.

The duty ratio converting means 4 comprises a coincidence circuit 41, a 4-bit counter 42, a NOR gate 43, a 4-bit counter 44 and an 8-bit counter 45. The coincidence circuit 41 comprises an exclusive OR circuit (EX-OR) with an inverted output thereof, and it is so arranged to convert a delay time obtained from the delay means 2 into the duty ratio. More specifically, a first pulse signal of the $\frac{1}{2}^9$ divided pulse signal is fed from the frequency divider circuit 33 to one input terminal of the coincidence circuit 41, while it is fed to the integration circuit 21 to provide a delay pulse signal or second pulse signal, the delay time of which varies depending on a change in the capacitance of the capacitor Cx. The delay pulse signal is fed to the other input terminal of the coincidence circuit 41 which provides an inverted signal of the signal representing the duty ratio or the third pulse signal.

The NOR gate 43 constitutes a gate circuit for receiving an output signal of the counter 42, or a carry signal of the counter 42, and the output signal of the coincidence circuit 41 as its control input signals. Accordingly, the NOR gate 43 permits the clock pulse signal (480 KHz) of the oscillation circuit 32 to pass therethrough by the number of pulses corresponding to the duty ratio of the output signal of the coincidence circuit 41 during the counter 42 counts thirty two pulses of the $\frac{1}{2}^9$ divided pulse signal.

The output signal of the NOR gate 43 or a digital value corresponding to the duty ratio is fed to the counter 44. Thus, the number of pulses of the output signal of the NOR gate 43 is counted by the counters 44 and 45. The result of counting obtained by the counters 44 and 45 is fed to the magnitude comparing means 7. It is noted that the magnitude comparing means 7 is connected to only the counter 45 and is not connected to the counter 44. Since the counter 44 is not connected directly to the magnitude comparing means 7, 1/32 of the whole number of pulses output from the NOR gate 43 is fed to the magnitude comparing means 7. That is, a mean value of the whole number of pulses output from the NOR gate 43 is fed to the magnitude comparing means 7. When the counter 45 overflows, an overflow signal OFL, or a carry signal of the counter 45, is fed to the output means 8. The output means 8 is arranged to provide an error signal ERR when it receives the overflow signal OFL from the counter 45. The output signal of the coincidence circuit 41 is fed also to a pulse discriminator circuit 60 which constitutes the coincidence comparing means 6.

Figure 3:
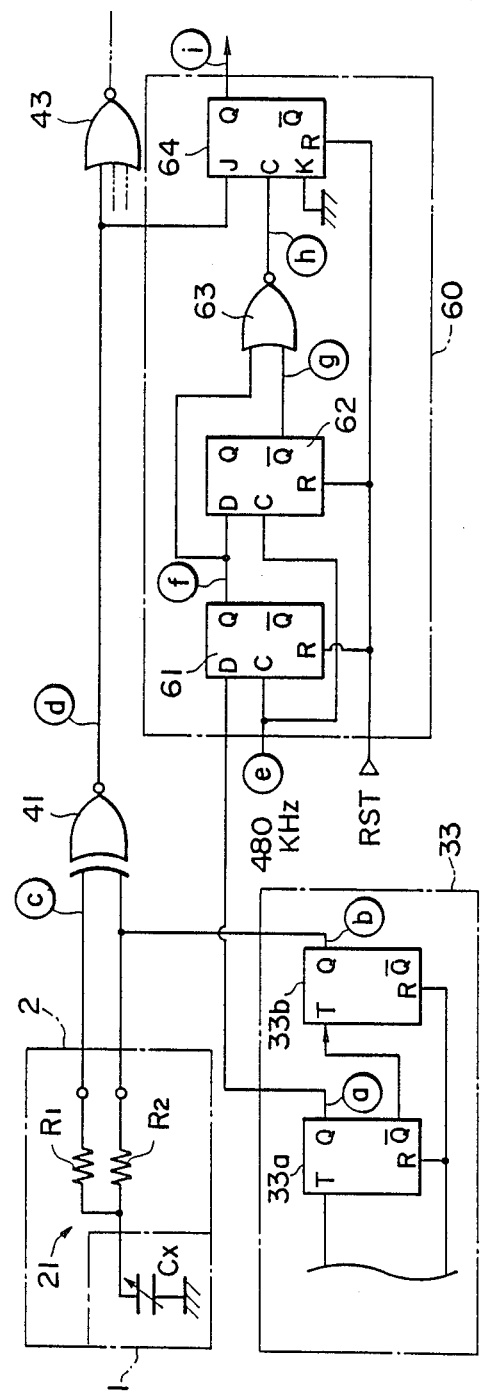
FIG. 3 is a detailed schematic of the pulse discriminator circuit 60 and a part of circuits connected thereto shown in FIG. 2.
Figure 4:
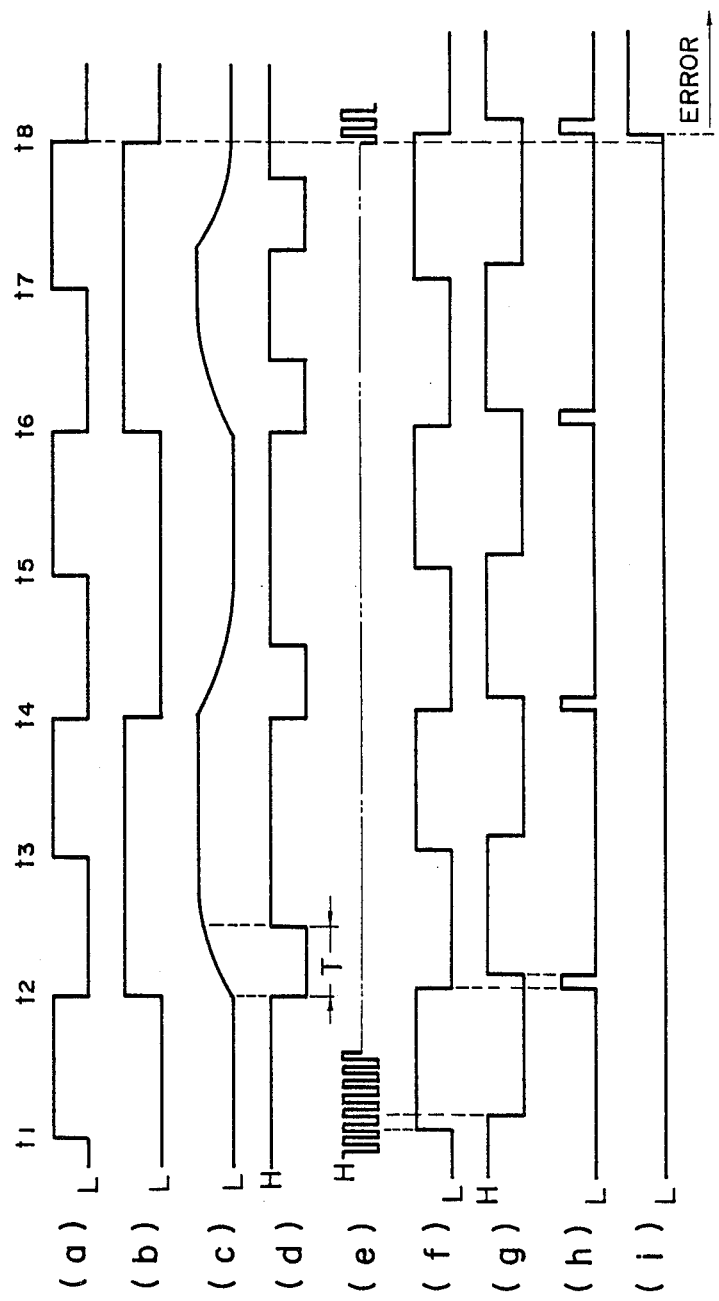
FIG. 4 is a timing chart showing operation of the circuit shown in FIG. 3.

The pulse discriminator circuit 60 and its related circuits will be described in detail referring to FIGS. 3 and 4. The pulse discriminator circuit 60 includes two D flip-flops 61 and 62, a NOR gate 63 and a JK flip-flop 64. The clock pulse signal (480 KHz) of the oscillation circuit 32 is respectively fed to clock terminals C of the flip-flops 61 and 62 for synchronization of the flip-flops with this clock pulse.

An output signal of a terminal Q of the D flip-flop 61 is fed to a terminal D of the D flip-flop 62 and also fed to one terminal of the NOR gate 63. The output signal of a terminal $\overline{Q}$ of the D flip-flop 62 is fed to the other terminal of the NOR gate 63. The output signal of the NOR gate 63 is fed to a clock terminal C of the JK flip-flop 64 as a clock pulse. Each reset terminal R of these D flip-flops 61, 62 and JK flip-flop 64 is connected to the reset circuit 10. A terminal J of the JK flip-flop 64 is connected to an inversion output terminal of the coincidence circuit 41 while its terminal K is grounded to set to a low level.

Two T flip-flops 33a and 33b constitute a part of the frequency divider circuit 33 shown in FIG. 2. The T flip-flop 33a is arranged to provide the $\frac{1}{2}^8$ divided pulse signal from its terminal Q, so that the T flip-flop 33b provides the $\frac{1}{2}^9$ divided pulse signal from its terminal Q to the integration circuit 21 since a terminal $\overline{Q}$ of the T flip-flop 33a is connected to a terminal T of the T flip-flop 33b. Each reset terminal R of these flip-flops 33a, 33b is connected to the reset circuit 10. The terminal Q of the T flip-flop 33a is connected to the terminal D of the D flip-flop 61.

The operation of the circuit shown in FIG. 3 will now be described wtih reference to a timing chart of a signal of each part shown in FIG. 4, wherein (a) through (i) designate a waveform in each point ⓐ through ⓘ of the circuit shown in FIG. 3.

At the outset, when power is supplied by the power source 11, all of the T flip-flops 33a, 33b, D flip-flops 61, 62 and JK flip-flop 64 are reset by the reset signal fed from the reset circuit 10 for initialization, so that each terminal Q of those flip-flops is held to a low level.

When the $\frac{1}{2}^7$ divided pulse signal (about 4 KHz) is fed to the terminal T of the T flip-flop 33a in the frequency divider circuit 33, this pulse signal is inverted at its leading edge and is divided into $\frac{1}{2}$. The resultant signal (about 2 KHz) shown in FIG. 4(a) is fed from the terminal Q of the flip-flop 33a to the terminal D of the D flip-flop 61. The inverted output signal is fed from the terminal $\overline{Q}$ of the T flip-flop 33a to the terminal T of the T flip-flop 33b. This output signal is inverted at its leading edge and is further divided into $\frac{1}{2}$. The resultant signal (about 1 KHz) shown in FIG. 4(b) is provided from the terminal Q of the T flip-flop 33b. This signal shown in FIG.4(b) is delayed through the integration circuit 21 and a signal shown in FIG. 4(c) with a delay part is provided therefrom. This signal (c) is fed to the coincidence circuit 41 together with the output signal (b) of the T flip-flop 33b to develop a signal representing the duty ratio, which is actually an inverted signal of the signal representing the duty ratio counted by the counter 44 as will be described later. More specifically, the coincidence circuit 41 inverts the output signal of the exclusive OR circuit (EX-OR) as described above to provide a high level coincidence output when both input signals are coincident with each other. Accordingly, the coincidence circuit 41 develops a signal shown in FIG. 4(d) with a low level part, or the delay part which does not reach a threshold level at both leading and trailing edges of the signal (c), so that time T shown in FIG. 4(d) varies depending upon a change in the capacitance of the capacitor Cx. In another word, by measuring the time T, the change in the capacitance of the capacitor Cx may be detected. Accordingly, the signal shown in FIG. 4(d) is arranged to control the NOR gate 43 to render the counter 44, 45 to count the number of clock pulses corresponding to the duty ratio.

The clock pulse signal of the oscillation circuit 32 shown in FIG. 4(e) is always fed to the pulse discriminator circuit 60 for synchronization of the two D flip-flops 61, 62 with this clock pulse signal. That is, the signal shown in FIG. 4(a) is fed to the terminal D of the D flip-flop 61, and it is provided from its terminal Q as it is at the leading edge of the clock pulse in FIG. 4(e) to provide a signal shown in FIG. 4(f) which is fed to the NOR gate 63. At the same time, the signal shown in FIG. 4(f) is fed to the terminal D of the D flip-flop 62. In the D flip-flop 62, the signal (f) is provided from its terminal Q as it is every leading edge of the clock pulse (e), while the inverted signal shown in FIG. 4(g) of the signal (f) is fed from its terminal $\overline{Q}$ to the NOR gate 63. Accordingly, the signal shown in FIG. 4(g) is the inversion signal of the signal shown in FIG. 4(f) and provides a pulse signal which is delayed by one pulse cycle of the clock pulse signal shown in FIG. 4(e). Then, the signals shown in FIG. 4(f) and (g) are fed to the NOR gate 63, which provides a signal shown in FIG. 4(h) corresponding to one pulse cycle of the clock pulse signal shown in FIG. 4(e). This signal shown in FIG.4(h) corresponds to a reference pulse signal according to the present invention and is fed to the clock terminal C of the JK flip-flop 64 to function as a clock pulse signal therefor.

In the pulse discriminator circuit 60, since the terminal K of the JK flip-flop 64 is held to be at a low level, its terminal Q provides a high level signal when the input signal of its terminal J is at a high level, whereas when a reset signal is fed to a reset terminal R, the inverted signal is provided from the terminal Q. Accordingly, when the signal shown in FIG. 4(h) is fed to the clock terminal C of the JK flip-flop 64, the input signal (d) is normally at a low level till $t_7$ as shown in FIG. 4. Therefore, the output signal of the terminal Q of the JK flip-flop 64 is at a low level as shown in FIG. 4(i). However, when a noise is introduced into the detecting means 1 or others, the signal (b) is not synchronized with the signal (c) as shown in FIG. 4 during the period between $t_7$ and $t_8$ for example. In this case, when the signal (h) is at a high level during the period starting from $t_8$, the signal (d) is maintained at a high level. Therefore, when the noise is introduced into the detecting means 1 or others, the JK flip-flop 64 provides a high level output signal as shown in FIG. 4(i). Accordingly, this high level output signal is fed to the output means 8 as an error signal ILG, so that the output means 8 may hold an output signal OUT in its previous state, which will be described later in detail.

Referring back to FIG. 2, the magnitude comparing means 7 comprises comparator circuits 71, 72, 73, a latch circuit 74 and an adder-subtractor circuit 75. Each circuit may be constituted from a combination of logic circuit elements and flip-flops or the like. The output signal from the counter 45 is fed to the comparator circuits 71 and 72 which compare this output signal with preset reference data A and B (hereinafter they merely referr to as reference A and B) respectively. When the output data from the counter 45 is more than the preset reference A, the comparator circuit 71 provides a signal PGA at a low level, or a first resultant signal according to the present invention. On the contrary, when the output data from the counter 45 is less than the preset reference B, the comparator circuit 72 provides a signal PLB at a low level, or a second resultant signal according to the present invention. The signals PGA and PLB of the comparator circuits 71 and 72 or the resultant signals of comparison are respectively fed to the output means 8, in which these signals are employed for indicating the presence or absence of a person respectively. When the output data from the counter 45 is equal to the reference A or B, this output data may be employed for indicating either the presence or absence of the person. The reference A is a value used for judgement of the present state of the presence of the person changed from the previous state of the absence of the person, and corresponds to the first reference value according to the present invention. Whereas, the reference B is a value used for judgement of the present state of the absence of the person changed from the previous state of the presence of the person, and corresponds to the second reference value according to the present invention.

Figure 5:
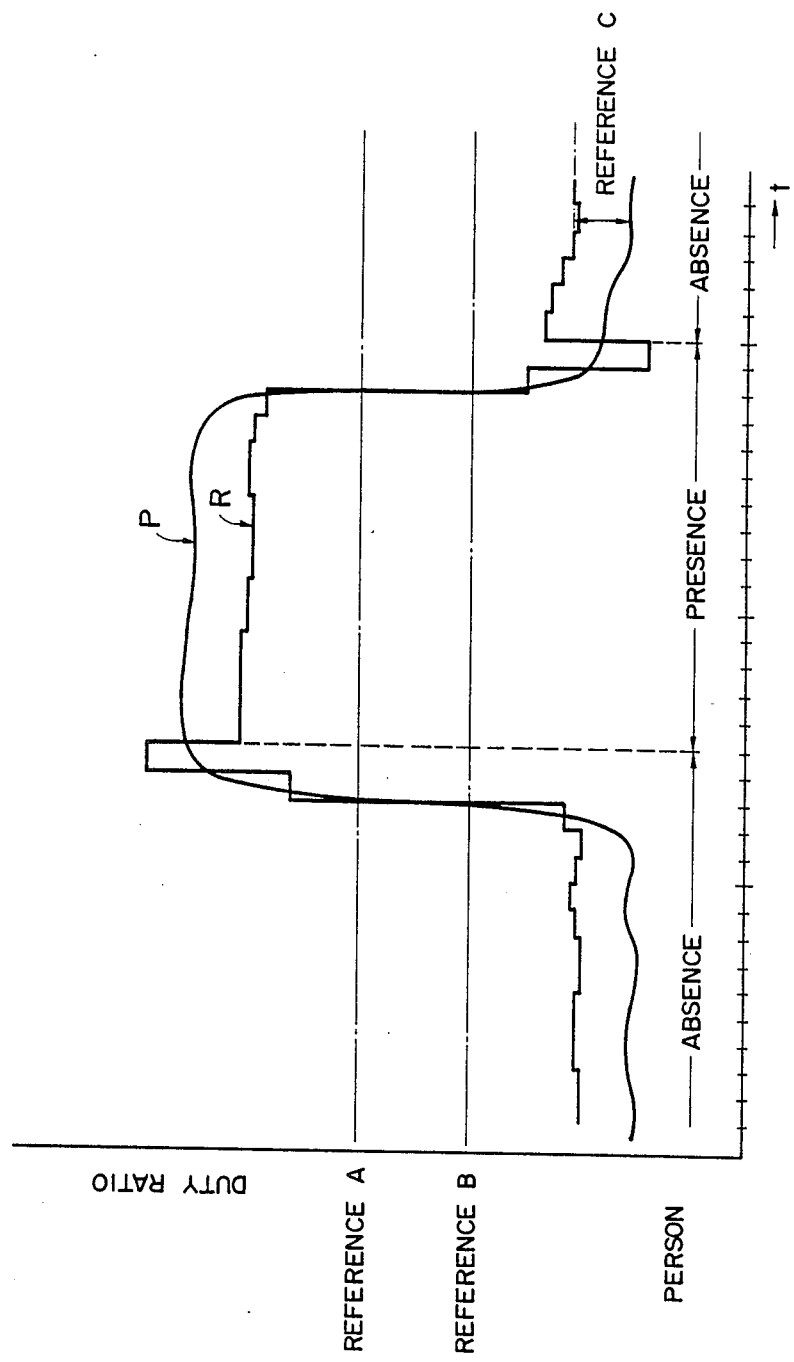
FIG. 5 is a diagram showing operation of the magnitude comparing means 7 shown in FIGS. 2B and 2C.

Values of those references are obtained experimentally as shown in FIG. 5, in which P designates the output of the counter 45, and R designates the output of the adder-subtractor circuit 75. In FIG. 5, P is illustrated as a continuous value so as to clearly distinguish P from R, but it has actually a stepwise variation similar to R, since P is a value quantified by the counter 45. Various reference values are determined experimentally as the references A and B since the capacitance of the capacitor Cx varies depending on the position of the electrode 17 to be mounted in the detecting means 1, or other factors. These references A and B are set in the comparator circuits 71 and 72 at 8-bits by means of switches or the like. At this time, the reference A is set independently of the reference B. Whether the object to be detected is a whole of the person body or a part thereof, whether it employs proximity sensing or contact sensing and whether the noise is heavy or not are examples of factors for setting the reference values. More specifically, when the person detecting device is applied to a device for preventing the person body from being caught by window panes in a power window system, the proximity sensing is employed, so that the references A and B are set to be lower than those shown in FIG. 5 to sharpen the sensitivity. On the contrary, it is better to employ the contact sensing when this device is applied to an automatic door locking device. In this case, the references A and B are set to be upper than those shown in FIG. 5 to deaden the sensitivity. As a countermeasure to the noise, the gap between the references A and B may be extended to provide a large hysteresis.

The adder-subtractor circuit 75 adds or subtracts the reference date C (hereinafter it merely referrs to as reference C) to or from the previous detection data by one cycle, and then the comparator circuit 73 compares the result of this operation R with the counter output P. When the counter output P varies by a value greater than the reference C, it is deemed that some noise joins the counter output P. As a countermeasure in this case, the counter 45 is connected to the latch circuit 74 to latch the output data from the counter 45 according to the output signal $Q_7$ of the ring counter 9. Accordingly, in the next cycle, the reference C is added to or subtracted from the data latched by the latch circuit 74 by the adder-subtractor circuit 75, and then the result of this operation R is compared with the counter output P by the comparator circuit 73. When R is equal to P in the magntiude thereof, the comparator circuit 73 provides a signal RED at a high level, when R is less than P, it provides a signal RLP at a high level and when R is more than P, it provides a signal RGP at a high level.

Further, the adder-subtractor circuit 75 is used for adding or subracting the reference C to or from the data of the latch circuit 74 according to an adder signal ADD or a subtractor signal SUB fed to an adder-subtractor terminal ASI. More specifically, when the output means 8 is detecting the presence of the person, the adder-subtractor circuit 75 subtracts the reference C from the data of the latch circuit 74, while when it is detecting the absence of the person, the circuit 75 adds the reference C to the data of the latch circuit 74. If an absolute value of a difference between the result of operation R and the counter output P is less than the reference C, the output means 8 makes the result of comparison between the counter output and the reference A or B effective, while if the absolute value of the difference is more than the reference C, it judges that the noise joins the counter output, so that the output state of the output means 8 is held unchanged. The above-described reference C is set at 4-bits by means of a switch or the like and corresponds to the third reference value according to the present invention. When the result of operation overflows, an overflow signal or carry signal CRY is provided from the output means 8.

Figure 6:
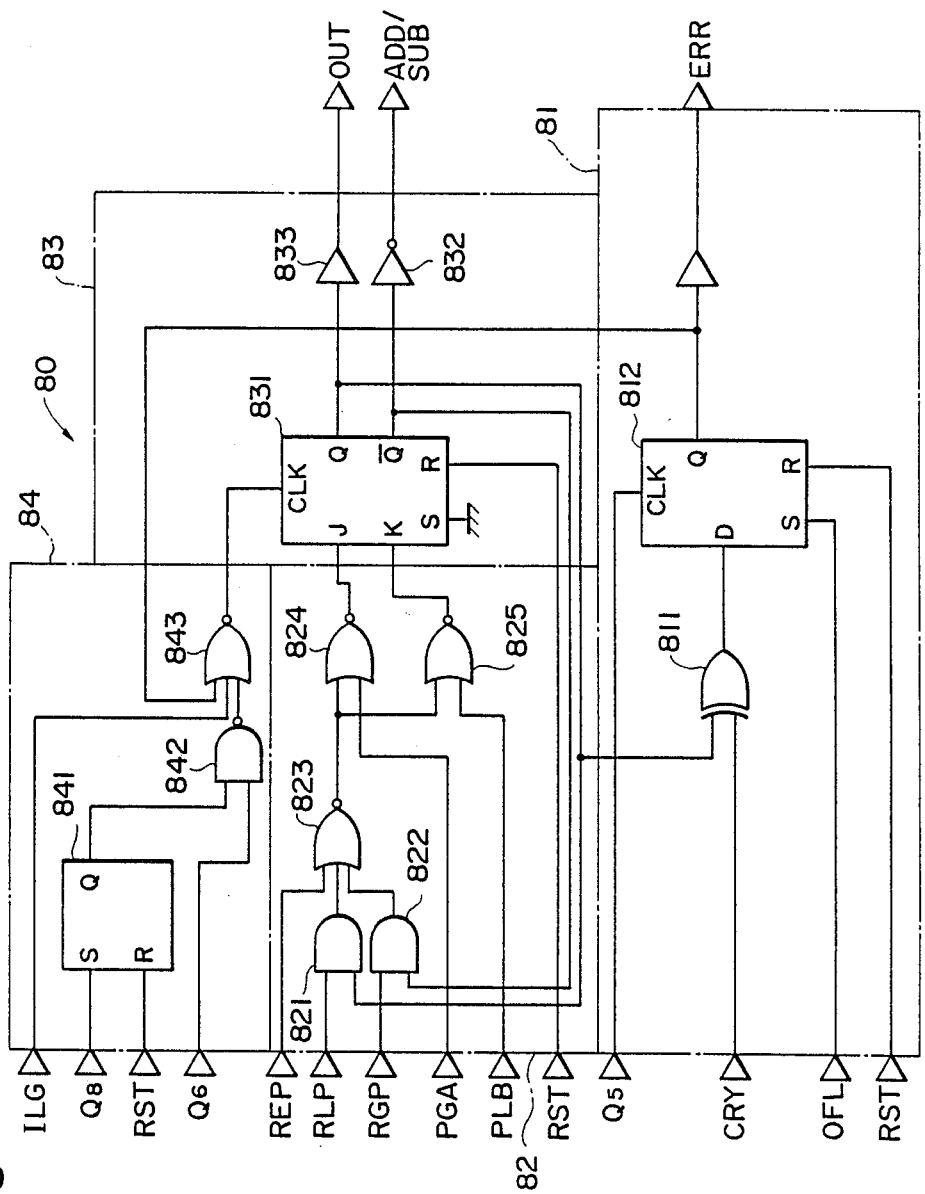
FIG. 6 is a detailed schematic of the output means 8 shown in FIG. 2C.

Referring to FIG. 6, the output means 8 comprises a judgement output circuit 80 which is provided with a judgement circuit 82, an output gate circuit 83 and an output timing circuit 84, and an error judgement circuit 81. The judgement circuit 82 receives the signals REP, RLP and RGP from the comparator circuit 73 and the signals PGA and PLB from the comparator circuits 71 and 72. It consists of AND gates 821 and 822, and NOR gates 823, 824, and 825.

A terminal Q of a JK flip-flop 831 of the output gate circuit 83 is connected to an input terminal of the AND gate 821 and the signal RLP of the comparator circuit 73 is fed thereto, while a terminal $\bar{Q}$ of the flip-flop 831 is connected to an input terminal of the AND gate 822 and the signal RGP of the comparator circuit 73 is fed thereto. Output terminals of these AND gates 821, 822 are connected to input terminals of the NOR gate 823 and the signal REP of the comparator circuit 73 is fed thereto, while an inversion output terminal of the NOR gate 823 is connected to respective input terminals of the NOR gates 824 and 825. Further, the signal PGA of the comparator circuit 71 is fed to the NOR gate 824, while the signal PLB of the comparator circuit 72 is fed to the NOR gate 825. An inversion output terminal of the NOR gate 824 is connected to a terminal J of the JK flip-flop 831, while an inversion output terminal of the NOR gate 825 is connected to a terminal K of the JK flip-flop 831. The JK flip-flop 831 of the output gate circuit 83 has a reset terminal R connected to the reset circuit 10 and a set terminal S grounded. Its terminal Q provides a signal of the result of judgement as the output signal OUT through a buffer amplifier 833 and its terminal $\bar{Q}$ provides the adder or subtractor signal ADD/SUB to the terminal ASI of the adder-subtractor circuit 75 through an inverter 832.

The output timing circuit 84, which is arranged to provide a clock signal to the JK flip-flop 831, comprises a RS flip-flop 841, a NAND gate 842 and a NOR gate 843. The RS flip-flop 841 and NAND gate 842 constitute a first gate circuit which prevents the clock signal from being fed to the JK flip-flop 831 until a first cycle of the ring counter 9 elapses after power is supplied by the power source 11, that is, until the signal $Q_8$ is fed. Further, the NOR gate 843 constitutes a second gate circuit which prevents the clock signal from being fed to the JK flip-flop 831 when the signal ILG is fed from the pulse discriminator circuit 60, or when the error judgement circuit 81 detects the error, which will be described later in detail. More specifically, the output timing circuit 84 prevents the clock signal from being fed to the JK flip-flop 831 until the first cycle of the ring counter 9 elapses after power is supplied by the power source 11 (since the output of the counter 45 is not latched by the latch circuit 74 during this cycle, so that judgement is not achieved correctly by the judgement circuit 82), when the signal ILG is fed from the pulse discriminator circuit 60, and when the error judgement circuit 81 detects the error. Therefore, the previous output state of the JK flip-flop 831 is maintained in those cases described above. A reset terminal R of the RS flip-flop 841 is connected to the reset circuit 10. A judgement output from the judgement circuit 82 is fed to the JK flip-flop 831. The JK flip-flop 831 latches the result of judgement of the judgement circuit 82 according to the timing of the signal $Q_6$ fed through the output timing circuit 84, and it provides the signal of the result of judgement.

The error judgement circuit 81 includes an exclusive OR circuit 811 for receiving the output signal from the terminal Q of the JK flip-flop 831 and the carry signal from the adder-subtractor circuit 75. This circuit 81 provides a high level output signal when the carry signal of the adder-subtractor circuit 75 is not coincident with the output signal of the terminal Q of the JK flip-flop 831. The D flip-flop 812 is set when its set terminal S receives the overflow signal OFL from the counter 45, and it provides the high level error signal ERR according to the input timing of the signal $Q_5$ to the clock terminal CLK when the exclusive OR circuit 811 provides a high level output signal. At this time, since the terminal Q of the D flip-flop 812 outputs a high level signal to the NOR gate 843, the clock signal is prevented from being fed to the JK flip-flop 831. Therefore, the previous output state of the output signal OUT is maintained. A reset terminal R of the D flip-flop 812 is connected to the reset circuit 10.

Hereinafter, the operation of the output means 8 will be descrived referring to FIGS. 2, 5 and 6.

First, it will be explained in a case where the state of the output representing the absence of the person is changed into the state of the output representing the presence of the person to provide a signal indicating the presence of the person. Referring to FIG. 6, in the state of output representing the absence of the person, the terminal Q of the JK flip-flop 831 provides a low level signal while its terminal $\bar{Q}$ provides a high level signal, so that the adder signal ADD at a low level is fed to the terminal ASI. Accordingly, the adder-subtractor circuit 75 is operated as the adder circuit which adds the reference C to the data latched by the latch circuit 74, and then the result of this operation R is compared with the counter output P of the counter 45 by the comparator circuit 73. If the result of operation R is more than the counter output P (R>P), the signal RGP of the comparator circuit 73 is at a high level. At this time, since the terminal $\bar{Q}$ of the JK flip-flop 831 provides a high level signal, the AND gate 822 also provides a high level signal. Therefore, the inversion output terminal of the NOR gate 823 provides a low level signal. Further, if the result of operation R is equal to the counter output P (R=P), the signal REP of the comparator circuit 73 is at a high level, and the circuits operate similarly to the case where the result of operation R is more than the counter output P.

In the above state, when the signal PGA of the comparator circuit 71 is at a low level or in a case where the counter output P exceeds the reference A as shown in FIG. 5, the inversion output terminal of the NOR gate 824 provides a high level signal which is fed to the terminal J of the JK flip-flop 831. On the other hand, since the terminal PLB provides a high level signal, the NOR gate 825 provides a low level signal to the terminal K of the JK flip-flop 831. Accordingly, a high level signal is provided from the terminal Q of the JK flip-flop 831 according to the clock signal which is fed from the output timing circuit 84 to the clock terminal CLK, whereby the output signal OUT is to indicate the presence of the person. In this state, when the result of operation R is more than the counter output P in the comparator circuit 73, it is understood that the counter output P has varied in excess of the reference C. In this case, since the signal RGP is at a high level while the signal RLP is at a low level, both the AND gates 821 and 822 provide low level signals. Further, since the signal REP is at a low level, the NOR gate 823 provides a high level signal, so that a low level signal is fed to the terminals J and K of the JK flip-flop 831. Accordingly, even if the JK flip-flop 831 receives the clock pulse, the previous output state of the JK flip-flop 831 is maintained. As has been described, when the counter output P varies in excess of the reference C, its variation is deemed as noise, so that any change in the output state is not made.

Next will be explained the operation of the output means 8 in a case where the state of the output representing the presence of the person is changed into the state of the output representing the absence of the person. When the presence of person is detected, the JK flip-flop 831 provides a high level signal from its terminal Q to the AND gate 821. Further, since a high level signal is fed to the terminal ASI, the adder-subtractor circuit 75 subtracts the reference C from the data latched by the latch circuit 74. Accordingly, the result of operation R becomes less than the counter output P (R<P), so that the signal RLP is at a high level.

Thus, the AND gate 821 provides a high level signal, so that the NOR gate 823 provides a low level signal. When the signal PLB of the comparator circuit 72 is at a low level, the NOR gate 825 provides a high level signal to the terminal K of the JK flip-flop 831. On the other hand, since the signal PGA of the comparator circuit 71 is at a high level, the NOR gate 824 provides a low level signal to the terminal J of the JK flip-flop 831. Therefore, when the output signal of the output timing circuit 84 is fed to the clock terminal CLK of the JK flip-flop 831, the terminal Q of this flip-flop provides a low level signal, whereby the output signal OUT is to indicate the absence of the person. In this state, when the result of operation R is less than the counter output P in the comparator circuit 73, it is understood that the counter output P has varied in excess of the reference C. In this case, since the signal RLP is at a high level while the signal RGP is at a low level, the AND gates 821 and 822 provide low level signals. Further, since the signal REP is at a low level, the NOR gate 823 provides a high level signal. Accordingly, a low level signal is fed to both terminals J and K of the JK flip-flop 831, so that even if the clock signal is fed to the JK flip-flop 831, the previous output state of the JK flip-flop 831 is maintained.

The overall operation of the present embodiment is described hereinafter. The operation of each circuit is controlled sequentially by the ring counter 9 shown in FIG. 2.

At the outset, when power is supplied by the power source 11, the reset circuit 10 is operative to reset the ring counter 9, frequency divider counter 33, counters 42, 44 and 45, pulse discriminator circuit 60, comparator circuits 71, 72, and 73, latch circuit 74 and adder-subtractor circuit 75 for initialization. When the ring counter 9 is operative, it resets the counters 42, 44 and 45 in the first step and starts the counter 42 to count to thirty two pulses to open a gate of the NOR gate 43 in the second step. During this operation, the $\frac{1}{2}^9$ divided pulse signal is fed to the integration circuit 21 and the coincidence circuit 41. Then, the coincidence between this pulse signal, or the first pulse signal, and the delay pulse signal, or the second pulse signal, delayed in response to the capacitance of the capacitor Cx is made by the coincidence circuit 41 to develop the signal representing the duty ratio, or the third pulse signal. The output signal of the coincidence circuit 41 is fed to the NOR gate 43 and also to the pulse discriminator circuit 60. At this time, the NOR gate 43 receives the clock pulse signal at a frequency of 480 KHz from the oscillation circuit 32, and provides clock pulses synchronized with a high level part of the inverted signal of the signal representing the duty ratio to the counter 44, while its gate is opened by the counter 42. More specifically, the number of clock pulses corresponding to the duty ratio which varies depending upon the change in the capacitance of the capacitor Cx is counted by the counters 44 and 45. The output signal of the coincidence circuit 41 is also fed to the pulse discriminator circuit 60. When the output signal of the integration circuit 21 includes a noise, the signal ILG at a high level is fed to the output means 8 from the pulse discriminator circuit 60.

The output data from the counter 45 is fed to the comparator circuits 71 and 72, which compare the output data with the preset reference A or B in magnitude. Then, the signal representing that the output data is more or less than the preset reference data in magnitude is fed to the output means 8 as the signal PGA or PLB. Further, the output data from the counter 45 is also fed to the comparator circuit 73 and the latch circuit 74. However, at this time, the latch circuit remains in its initialized state. It is in the seventh step of the ring counter 9 that the output data is fed to the latch circuit 74 for the first time. Namely, the correct result of comparison is not provided from the comparator circuit 73 in the first cycle. Therefore, the output gate is closed in the eighth step of the first cycle. On and after the second cycle, the output data in the previous cycle from the counter 45 is latched by the latch circuit 74. Accordingly, the adder-subtractor circuit 75 addes or subtracts the reference C to or from the above output data and then the result of comparison of its resultant data with the output data of the counter 45 is fed to the output means 8.

In the second step through the fourth step of the ring counter 9, the counter 42 is counting to thirty two pulses. During this counting operation, the above operation is performed. In the fifth step of the ring counter 9, when the overflow of the counter 45 is detected, the signal representing the error is provided so as to proceed the operation to the next cycle without performing the operation in the sixth step.

In the sixth step, the outputs from the comparator circuits 71 and 72 are judged according to the signal Q6 on and after the second cycle. More specifically, provided that the difference between the result of operation R and the counter output P is within the range of the reference C, when a signal representing that the output data of the counter 45 is more than the reference A is fed to the output means 8, a signal indicating the presence of the person is provided, while when a signal representing that it is less than the reference B is fed to the output means 8, a signal indicating the absence of the person is provided. Further, when a high level error signal ILG is fed from the pulse discriminator circuit 60 to the output means 8, the output signal OUT is maintained in its previous state.

In the seventh step, the output data of the counter 45 is latched by the latch circuit 74 to prepare for the operation in the next cycle. In the eighth step, the output gate is closed as described above in the first cycle, while it is opened on and after the second cycle.

It should be apparent to one skilled in the art that the above-described embodiment is merely illustrative of but a few of the many possible specific embodiments of the present invention. For example, a mircoprocessor might be adopted for the above-described device. The above-described device may be used for counting number of persons entered into a theater or the like. Numerous and various other arrangements can be readily devised by those skilled in the art without departing from the spirit and scope of the invention as defined in the following claims.

What is claimed is:

1. A person detecting device for detecting the presence and absence of a person comprising:

sensing means for sensing capacitance between at least a pair of electrodes facing to each other with a space, said capacitance varying depending upon the presence and absence of the person in said space;

oscillating means for providing a first pulse signal;

delay means for delaying said first pulse signal and providing a second pulse signal delayed in response to said capacitance of said sensing means;

duty ratio converting means for receiving said first and second pulse signal and providing a third pulse signal of a duty ration determined in response to said capacitance to convert said third pulse signal to a value representing said duty ratio; comparing means for comparing said value representing said duty ratio with at least a reference value preset for judging as to the presence and absence of the person to provide a resultant signal of comparison; and output means for receiving said resultant signal of said comparing means and judging as to the presence and absence of the person to output a signal of the result of judgement;

wherein said oscillating means includes means for generating a clock pulse signal at a predetermined frequency and means for dividing said clock pulse signal into a plurality of divided pulse signals of different frequencies and providing one of said divided pulse signals as said first pulse signal, and wherein said duty ratio converting means includes means for converting said third pulse signal to a digital value corresponding to said duty ratio based on said clock pulse signal.

2. A person detecting device for detecting the presence and absence of a person comprising;

sensing means for sensing capacitance between at least a pair of electrodes provided in a vehicle and facing to each other with a space, said capacitance varying depending upon the presence and absence of the person in said space;

oscillating means for generating a clock pulse signal at a predetermined frequency and dividing said clock pulse signal into a plurality of divided pulse signals of different frequencies to provide one of said divided pulse signals as a first pulse signal;

delay means for delaying said first pulse signal and providing a second pulse signal delayed in response to said capacitance of said sensing means;

a coincidence circuit for receiving said first pulse signal and said second pulse signal to provide a third pulse signal of a duty ratio determined in response to said capacitance;

a gate circuit connected to said oscillating means and said coincidence circuit for converting said third pulse signal to a digital value corresponding to said duty ratio based on said clock pulse signal;

a first counter connected to said oscillating means for enabling said gate circuit for a predetermined period;

a second counter connected to said gate circuit for receiving said digital value and permitting said digital value to gate for a period determined by said first counter;

a first comparing circuit connected to said second counter for comparing said digital value in magnitude with a first reference value preset for judging the presence of the person and a second reference value preset for judging the absence of the person, and said first comparing circuit providing a first resultant signal representing the presence of the person when said digital value is more or less than said first reference value, and provides a second resultant signal representing the absence of the person when said digital value is less or more than said second reference value;

control means connected to said oscillating means for providing a series of control signals in accordance with a predetermined sequence;

a latch circuit connected to said second counter for latching said digital value received therefrom in accordance with a control signal from said control means;

an adder-subtractor circuit connected to said latch circuit for adding or subtracting a third reference value to or from said latched value depending on the state of said first and second resultant signals; a second comparing circuit connected to said adder-subtractor circuit for comparing a resultant value thereof with said digital value received in the following control signal from said control means; and output means connected to said first and second comparing circuits for receiving outputs therefrom and providing a signal indicating the presence of the person when said first resultant signal is fed and a signal indicating the absence of the person when said second resultant signal is fed, provided that the absolute value of difference between said resultant value of said adder-subtractor circuit and said digital value fed from said second counter is less than said third-reference value, said output means including means for holding said signal of the presence and absence of the person as in the preceding state thereof when said absolute value of difference exeeds said third reference value.

3. A person detecting device as set forth in claim 1, wherein said comparing means comprises magnitude comparing means for comparing said digital value in magnitude with at least a reference value preset for judging as to the presence and absence of the person.

4. A person detecting device as set forth in claim 3, wherein said comparing means further comprises coincidence comparing means coupled to said oscillating means for producing a reference pulse signal of the same frequency as said first pulse signal and comparing said third pulse signal with said reference pulse signal in periodic coincidence to provide an error signal to said output means when said third pulse signal do not snychronize with said reference pulse signal.

5. A person detecting device as set forth in claim 4, wherein said output means includes means for holding said signal of the result of judgement unchanged when said error signal is fed thereto.

6. A person detecting device as set forth in claim 3, wherein said magnitude comparing means includes means for setting a first reference value for judging the presence of the person and a second reference value for judging the absence of the person, and means for providing a first resultant signal representing the presence of the person when said digital value is more or less than said first reference value, and provides a second resultant signal representing the absence of the person when said digital value is less or more than said second reference value.

7. A person detecting device as set forth in claim 6, wherein said magnitude comparing means further includes means for setting a third reference value for distinguishing said digital value from the value changed more than a predetermined value in magnitude, and wherein said output means includes means for holding said signal of the result of judgement unchanged when the absolute value of the change in said digital value exceeds said third reference value.

8. A person detecting device as set forth in claim 7, wherein said duty ratio converting means comprises a coincidence circuit for receiving said first pulse signal and said second pulse signal to provide said third pulse signal, and a gate circuit connected to said oscillating means and said coincidence circuit for developing said digital value.

9. A person detecting device as set forth in claim 8, wherein said duty ratio converting means further comprises a first counter connected to said oscillating means for enabling said gate circuit for a predetermined period, and a second counter connected to said gate circuit for receiving said digital value and permitting said digital value to be fed to said magnitude comparing means for a period determined by said first counter.

10. A person detecting device as set forth in claim 9, wherein said coincidence circuit comprises an exclusive OR circuit.

11. A person detecting device as set forth in claim 9, further comprising control means connected to said oscillating means for controlling said duty ratio converting means, said magnitude comparing means and said output means to be operated in accordance with a predetermined sequence, wherein said magnitude comparing means is arranged to latch said digital value received in a cycle of said sequence and compare said latched value with said digital value received in the following cycle of said sequence.

12. A person detecting device as set forth in claim 11, wherein said magnitude comparing means comprises a latch circuit for latching said digital value received in accordance wtih a control signal fed from said control means, an adder-subtractor circuit connected to said latch circuit for adding or subtracting said third reference value to or from said latched value depending on the state of said first and second resultant signals, and a comparing circuit connected to said adder-subtractor circuit for comparing a resultant value thereof with said digital value received in accordance with the following control signal fed from said control means.

13. A person detecting means as set forth in claim 12, wherein said output means includes means for receiving outputs from said magnitude comparing means and providing a signal indicating the presence of the person when said first resultant signal is fed and a signal indicating the absence of the person when said second resultant signal is fed, provided that the absolute value of difference between said resultant value of said adder-subtractor circuit and said digital value fed from said second counter is less than said third reference value.

14. A person detecting device as set forth in claim 1, wherein said sensing means comprises a pair of electrodes constituted by a vehicle body and at least an electrode provided on a vehicle seat for forming a capacitor therebetween.

15. A person detecting device for detecting the presence and absence of a person comprising:
sensing means for sensing capacitance between at least a pair of electrodes facing to each other with a space, said capcacitance varying depending upon the presence and absence of the person in said space;
oscillating means for providing a first pulse signal;
delay means for delaying said first pulse signal and providing a second pulse signal delayed in response to said capacitance of said sensing means;
duty ratio converting means for receiving said first and second pulse signal and providing a third pulse signal of a duty ration determined in response to said capacitance to convert said third pulse signal to a value representing said duty ratio;
comparing means for comparing said value representing said duty ratio with at least a reference value preset for judging as to the presence and absence of the person to provide a resultant signal of comparison,
said comparing means comprising coincidence comparing means coupled to said oscillating means for producing a reference pulse signal of the same frequency as said first pulse signal and comparing said third pulse signal with said reference pulse signal in periodic coincidence to provide an error signal to said output means when said third pulse signal do not synchronize with said reference pulse signal; and
output means for receiving said resultant signal of said comparing means and judging as to the presence and absence of the person to output a signal of the result of judgement.

16. A person detecting device as set forth in claim 2, further comprising coincidence comparing means coupled to said oscillating means for producing a reference pulse signal of the same frequency as said first pulse signal and comparing said third pulse signal with said reference pulse signal in periodic coincidence to provide an error signal to said output means when said third pulse signal do not synchronize with said reference pulse signal, wherein said output means includes means for holding said signal of the result of judgement unchanged when said error signal is fed thereto.

17. A person detecting device as set forth in claim 15, wherein said oscillating means includes means for generating a clock pulse signal at a predetermined frequency and means for dividing said clock pulse signal into a plurality of divided pulse signals of different frequences and providing one of said divided pulse signals as said first pulse signal, wherein said duty ratio converting means includes means for converting said third pulse signal to a digital value corresponding to said duty ratio based on said clock pulse signal, and
wherein said comparing means comprises magnitude comparing means for comparing said digital value in magnitude with at least a reference value preset for judging as to the presence and absence of the person, said magnitude comparing means including means for setting a first reference value for judging the presence of the person and a second reference value for judging the absence of the person, and means for providing a first resultant signal representing the absence of the person when said digital value is less or more than said second reference value.

18. A person detecting device as set forth in claim 15, wherein said output means includes means for holding said signal of the result of judgement unchanged when said error signal is fed thereto.

19. A person detecting device as set forth in claim 17, wherein said magnitude comparing means further includes means for setting a third reference value for distinguishing said digital value from the value changed more than a predetermined value in magnitude, and wherein said output means includes means for holding said signal of the result of judgement unchanged when the absolute value of the change in said digital value exceeds said third reference value.

20. A person detecting device as set forth in claim 19, wherein said duty ratio converting means comprises a coincidence circuit for receiving said first pulse signal and said second pulse signal to provide said third pulse signal, and a gate circuit connected to said oscillating means and said coincidence circuit for developing said digital value.

* * * * *